(12) United States Patent
Ivanov et al.

(10) Patent No.: US 6,700,522 B2
(45) Date of Patent: Mar. 2, 2004

(54) SIGNAL SETTLING DEVICE AND METHOD

(75) Inventors: Vadim V. Ivanov, Tucson, AZ (US); Kevin Huckins, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/154,165

(22) Filed: May 23, 2002

(65) Prior Publication Data

US 2003/0218482 A1 Nov. 27, 2003

Related U.S. Application Data

(63) Continuation of application No. 09/784,724, filed on Dec. 15, 2001, now Pat. No. 6,437,645.

(51) Int. Cl.⁷ .............................................. H03M 1/12
(52) U.S. Cl. ............................ 341/155; 341/18; 330/9; 330/107
(58) Field of Search ................................ 341/118, 120, 341/122, 144, 155, 143; 330/9, 107, 109, 924, 126, 151

(56) References Cited

U.S. PATENT DOCUMENTS

| | | | | |
|---|---|---|---|---|
| 4,783,637 A | * | 11/1988 | Cotreau | 330/295 |
| 4,912,423 A | * | 3/1990 | Milkovic et al. | 330/8 |
| 4,937,579 A | * | 6/1990 | Maio et al. | 341/165 |
| 4,973,974 A | * | 11/1990 | Suzuki | 341/118 |
| 5,045,805 A | * | 9/1991 | Schanen | 330/107 |
| 5,164,726 A | * | 11/1992 | Bernstein et al. | 341/120 |
| 5,583,713 A | * | 12/1996 | Real et al. | 360/77.08 |
| 5,748,129 A | * | 5/1998 | Tsumura | 341/155 |
| 6,084,539 A | * | 7/2000 | Yamada | 341/155 |
| 6,195,400 B1 | * | 2/2001 | Maeda | 375/327 |
| 6,359,512 B1 | | 3/2002 | Ivanov et al. | |
| 6,411,240 B1 | * | 6/2002 | Greitschus | 341/155 |

* cited by examiner

Primary Examiner—Michael Tokar
Assistant Examiner—Linh V Nguyen
(74) Attorney, Agent, or Firm—W. Daniel Swayze, Jr.; W. James Brady; Frederick J. Telecky, Jr.

(57) ABSTRACT

A method and device are configured for providing for both quick and accurate signal settling. A high accuracy component is configured in parallel with a high speed component. The high accuracy component may be an op-amp. The high speed component may be an OTA that is configured to be a non-linear OTA. Furthermore, an ADC is configured to internally provide both quick and accurate signal settling. For example, an ADC comprises an internal high speed OTA configured in parallel with a connected external op-amp. The OTA is configured to be a non-linear OTA.

15 Claims, 6 Drawing Sheets

SIGNAL SETTLING DEVICE AND METHOD

CROSS-REFERENCE TO RELATED APPLICATIONS

This application claims the benefit of, and priority to, U.S. patent application Ser. No. 09/784,724, filed Feb. 15, 2001 is now a U.S. Pat. No. 6,437,645, and entitled "Slew Rate Boost Circuitry and Method", having a common inventor and common assignee with the present application.

FIELD OF INVENTION

The present invention generally relates to a settling system for use in microcontroller-based products. More particularly, the present invention relates to an amplifier system for fast settling of an input signal, such as for high-speed, high accuracy analog to digital converters.

BACKGROUND OF THE INVENTION

As the demand continues to increase for higher performance, microcontroller-based products, particularly for use in communication and processing applications, the need for improvements in the components and devices within these products also increases. This need is particularly keen in connection with analog to digital converters ("ADC's"), as are used, for example, to convert analog sound and video signals into digital sound and video signals respectively. Microcontroller-based products incorporating analog to digital converters include various digital devices, such as clock radios, microwave ovens, digital video recorders and the like.

While present day ADC's are quite fast and accurate, to meet and exceed the likely demand for even higher performance electronic equipment, improvements are needed in the methods and devices which enable quick and accurate settling of the input signal to the ADC. Currently available high accuracy op-amps are generally not fast enough, and currently available high speed op-amps typically are not accurate enough to meet these needs. For example, high accuracy op-amps take a relatively long amount of time to zero in on an accurate signal level. This "slow settling" can be even more evident at voltage levels greater than one volt, and many microprocessor based devices operate between one and five volts. On the other hand, high speed op-amps while generally offering "fast settling", often have a high gain error and/or offset error which reduces the accuracy of the op-amp.

Similarly, other available "fast settling" devices, such as an operational transconductance amplifier ("OTA") also tend to be insufficient to meet all of the anticipated design requirements. For example, because the OTA is a single stage, low gain, open-loop system, inaccuracies often obtain, even though the ADC capacitor can be quickly charged and the output signal settled quickly. Accordingly, a need exists for a system for settling the input to an ADC that addresses the ever increasing demands for fast and accurate microelectronic devices.

SUMMARY OF THE INVENTION

While the way in which the present invention addresses the above described needs will be described in greater detail hereinbelow, in general, available devices are suitably combined in an advantageous manner to facilitate both high signal settling rate as well as high accuracy signal settling. For example, in accordance with one exemplary embodiment of the present invention, a signal settling system comprises a high accuracy op-amp and a high speed OTA suitably configured to generate high speed, high accuracy signal settling. In accordance with another exemplary embodiment of the present invention, a high accuracy op-amp is configured in parallel with a high speed OTA and/or the high speed OTA is configured to be a non-linear OTA.

In accordance with another aspect of the present invention, an ADC is configured to internally facilitate both quick and accurate signal settling. In accordance with an exemplary embodiment of the present invention, an ADC comprises an internal high speed OTA configured in parallel with a connected external op-amp.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

Figure 1:
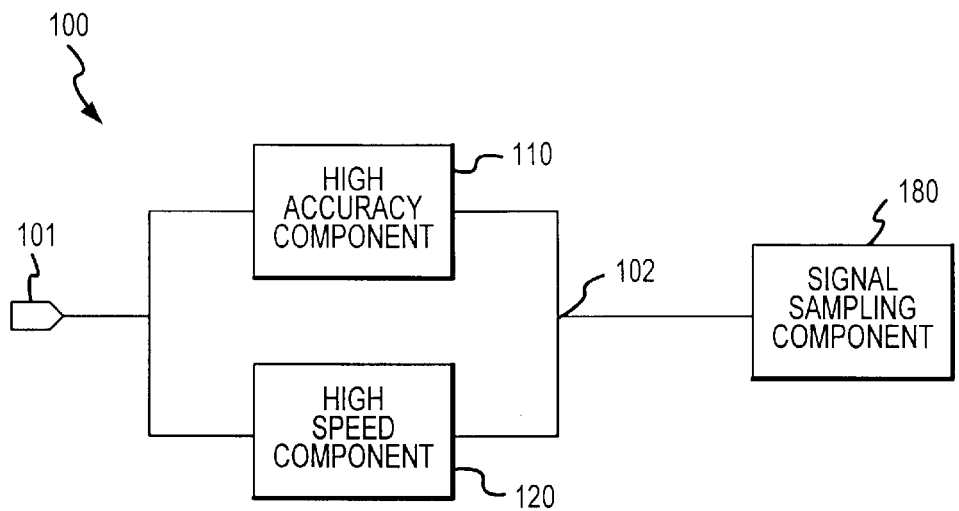
FIG. 1 illustrates a block diagram of an exemplary signal settling system in accordance with an exemplary embodiment of the present invention.

The present invention may be described herein in terms of various functional components and various processing steps. It should be appreciated that such functional components may be realized by any number of hardware or structural components configured to perform the specified functions. For example, the present invention may employ various integrated components, such as buffers, current mirrors, and logic devices comprised of various electrical devices, e.g., resistors, transistors, capacitors, diodes and the like, whose values may be suitably configured for various intended purposes. For purposes of illustration only, exemplary embodiments of the present invention will be described herein in connection with analog to digital converters. Further, it should be noted that while various components may be suitably coupled or connected to other components within exemplary circuits, such connections and couplings can be realized by direct connection between components, or by connection through other components and devices located therebetween.

As discussed above, a need exists for a signal settling system that addresses the generally increasing demands for fast and accurate signal settling. Prior attempts to make high speed op-amps more accurate often have resulted in slower op-amps. Furthermore, attempts to speed up high accuracy amplifiers have resulted in a loss of op-amp accuracy.

That being said, in accordance with one aspect of the present invention, at least one high speed component is suitably combined with at least one high accuracy component to provide a signal settling system having both high speed and high accuracy signal settling capabilities. The signal settling system is configured, for example, to settle the input to a signal sampling component.

In this context, the term "high speed component" refers to devices that can rapidly settle a signal, irrespective of its accuracy. For example, the high speed component may be configured to rapidly slew current, i.e., drive current from one limit to another over a dynamic range, to the signal sampling component for high speed signal settling. On the other hand, the term "high accuracy component" generally refers to any device that can settle the signal with a relatively high degree of accuracy. For example, the high accuracy component may be configured to accurately finish adjusting the current provided to the signal sampling component. Together the high speed and high accuracy component facilitate settling a signal both quickly and accurately.

Viewed from another perspective, and in accordance with another aspect of the present invention, a signal settling system is configured for rapidly charging the input capacitor(s) of a high performance signal sampling component. For example, a high accuracy component is configured with a high speed component such that, given a large differential input voltage, the high speed component may suitably provide large current and fast slewing to rapidly charge the signal sampling component input capacitor(s). The high accuracy component may suitably finish charging the signal sampling component input capacitor(s) with a high degree of accuracy. Furthermore, the high speed component may be configured to provide a large output current when input error is large, and a small output current when input error is small. Thus configured, the high speed component may dominate the initial portion of the settling process and high accuracy component may dominate the final portion of the settling process. As an example of the performance needs of emerging ADC's, op-amp output voltage may be required to be accurate to within 0.0015% of the full scale voltage range. To meet this performance standard on, for example, a 10 volt full scale range, the op-amp may be required to settle to within 100 to 150 micro-volts of the true voltage level in less than 500 nanoseconds.

In an exemplary embodiment of the present invention, a high speed component, such as an OTA, may be configured to settle a signal to within less than about 100 mV, more preferably to within about five to about 50 mV, and even more preferably to within about 10 to about 20 mV in a first time period. The first time period may be less than about 500 nanoseconds, preferably about 25 to about 250 nanoseconds, and more preferably about 50 to about 100 nanoseconds. The signal can then be further settled by a high accuracy component to within less than 300 micro-volts, more preferably to within about 50 to about 200 micro-volts, and more preferably to within about 100 to about 150 micro-volts in a second time period. The second time period may be less than 800 nanoseconds, preferably about 100 to about 500 nanoseconds, and more preferably about 200 to about 300 nanoseconds. Therefore, in the above example, an approximate overall 250 to 400 nanosecond settling time is achievable even with a large, e.g., 3–4 volts, initial input error.

The signal sampling component may comprise any device that can receive a signal and interpret the signal. In one example, the signal sampling component is configured to convert analog signals to the digital equivalent of the analog signals. For example, the signal sampling component may be an ADC.

One or more high speed components may be suitably combined with one or more high accuracy components in various ways. In accordance with an exemplary embodiment of the present invention, a signal settling system comprises a high accuracy component suitably configured in parallel with a high speed component. With reference now to FIG. 1, an exemplary signal settling system 100 comprises a high accuracy component 110, a high speed component 120, and a signal sampling component 180. High accuracy component 110 and high speed component 120 may be configured to share a common signal input 101 and a common signal output 102. Signal output 102 may be connected to signal sampling component 180.

In various exemplary signal settling systems, the components may comprise any number of hardware and/or structural components configured to perform the specified functions. Furthermore, the components may be combined into fewer components. For example, and without changing the general circuit connections, high speed component 120 may be included within signal sampling component 180. In another example, signal sampling component 180 may include both high accuracy component 110 and high speed component 120.

Figure 2:
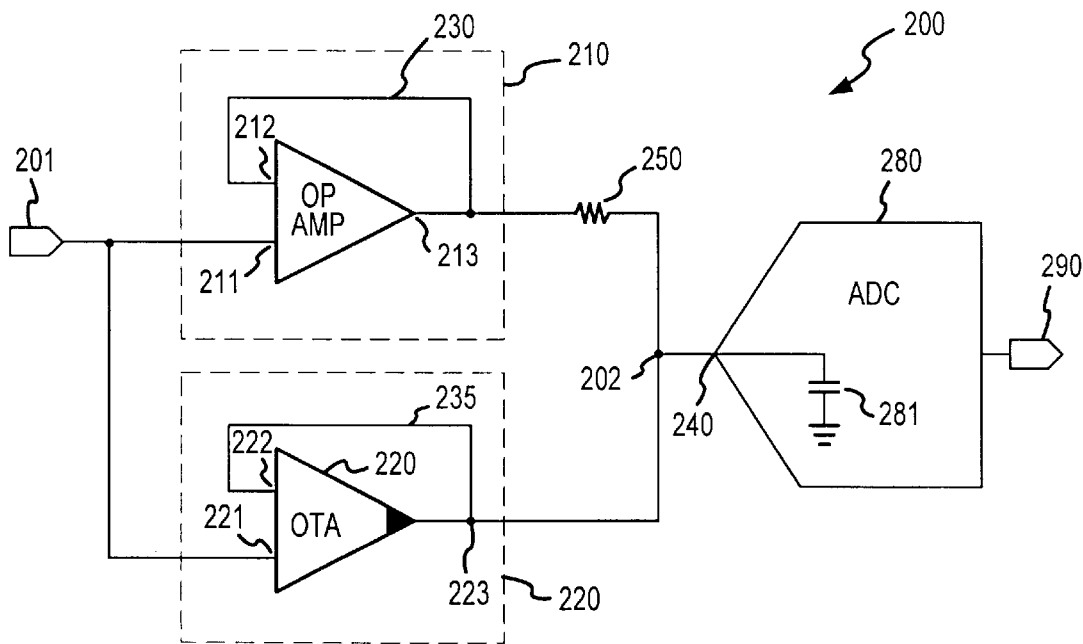
FIG. 2 illustrates another block diagram of an exemplary signal settling system in accordance with an exemplary embodiment of the present invention.

High accuracy component 110 may be any amplifier device, for example, a differential amplifier. In one exemplary embodiment of the present invention, and with reference to FIG. 2, a signal settling system 200 comprises a high accuracy component such as an op-amp 210. Op-amp 210 may be configured to be a high accuracy op-amp, and may suitably be configured as a BiFET, Bipolar, BiCmos, CMOS op-amp, and/or the like. Op-amp 210 may or may not be configured to have rail-to-rail capability and may be configured in single, dual, or quad channel amplifiers. Where high accuracy component 110 is an op-amp, such as op-amp 210, op-amp 210 may be configured with a first input 211, a second input 212, and an output 213. First input 211 may be connected to common input 201. Output 213 may be connected to second input 212 via a feedback loop 230. Feedback loop 230 may suitably facilitate high accuracy signal settling. Second input 212 may, for example, be a negative input to op-amp 210. Furthermore, output 213 may be suitably connected to common output 202 via a resistor 250. Resistor 250 may have any suitable value, for example, approximately 50 ohms. Common output 202 is suitably connected to a signal sampling component such as ADC 280.

High speed component 120 may be any signal processing device, for example, an operational transconductance amplifier or a high-speed OpAmp. In one exemplary embodiment of the present invention, the high speed component of signal settling system 200 comprises an operational transconductance amplifier ("OTA") 220. OTA 220 may be configured with a first OTA input 221, second OTA input 222, and an OTA output 223. First OTA input 221 may be connected to common input 201 and OTA output 223 may be connected to second OTA input 222 via a feedback loop 235. Second OTA input 222 may, for example, be a negative input to OTA 220. Furthermore, OTA output 223 may suitably be connected to common output 202. OTA 220 may be suitably connected as a follower between common input 201 and common output 202. Furthermore, in one exemplary embodiment of the present invention, OTA 220 may have a low DC gain. OTA 220 may suitably be configured for fast slewing of current and may also be configured to have a high output impedance.

OTA 220 may be implemented using as either a linear OTA or a non-linear OTA. Furthermore, OTA 215 may also comprise other devices that are configured to quickly settle a signal and that are stable with capacitive loads. In accordance with one aspect of the present invention, a linear OTA may be configured to provide an amplified and shielded output current that is proportional to the difference in voltage between two inputs. For example, a differential input stage may be suitably configured to divide a constant current flow between two control lines to each of two current mirrors. The current flow may be divided proportional to the difference between two inputs to the OTA. The current mirrors may be configured to provide a shield between the OTA input and the OTA output, thus providing the OTA with a high output impedance. An OTA may also comprise, for example, a single stage, low gain, and/or open-loop system.

Figure 3:
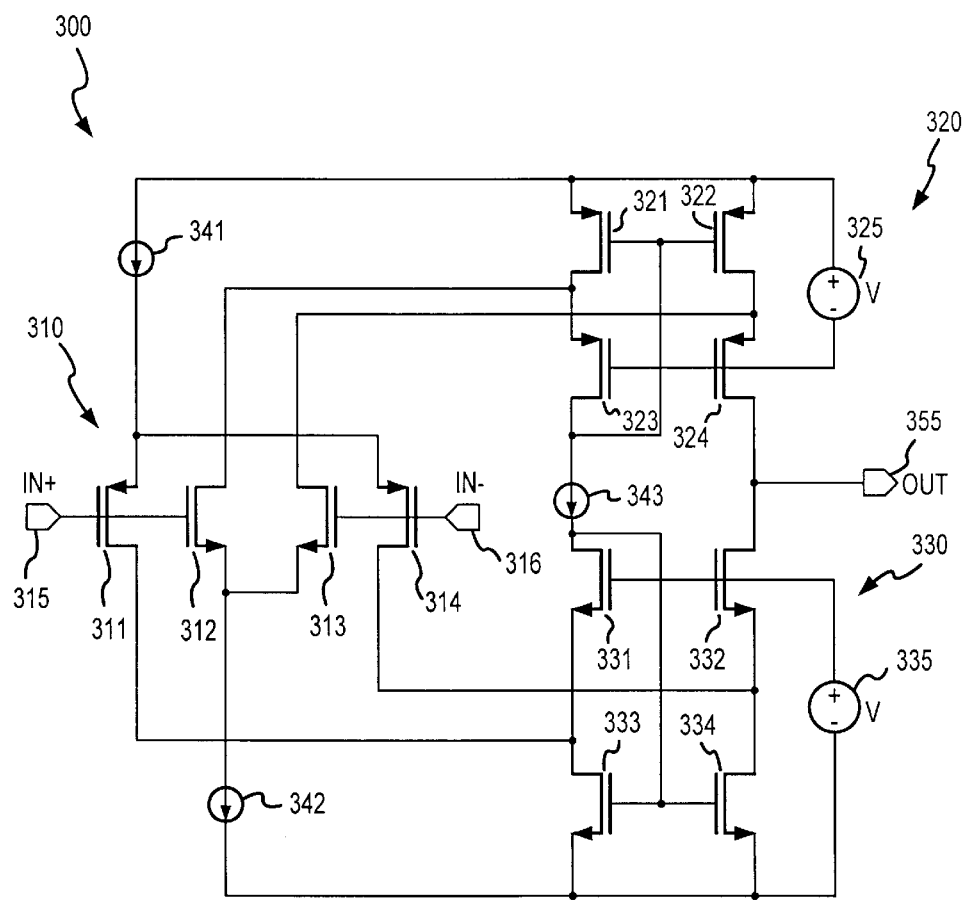
FIG. 3 illustrates a schematic diagram of an exemplary OTA device in accordance with an exemplary embodiment of the present invention.

With reference now to FIG. 3, and in accordance with an exemplary embodiment of the present invention, a linear OTA 300 suitably comprises a differential input stage 310 including, for example, a positive differential input 315 and a negative differential input 316. Differential input stage 310 may further comprise P-type and N-type transistors 311, 312, 313, and 314, and may be configured with current sources 341 and 342.

OTA 300 may also comprise an upper current mirror 320 comprising N-type transistors 321–324 and voltage source 325. OTA 300 may further comprise a lower current mirror 330 comprising P-type transistors 331–334 and voltage source 335. A current source 343 may be connected between upper current mirror 320 and lower current mirror 330. An output 355 is also connected between upper current source 320 and lower current source 330. Output 355 may be connected to negative input 316 in a feedback loop.

In accordance with another aspect of the present invention, with reference again to FIG. 2, OTA 220 is configured to be a non-linear OTA. A non-linear OTA is suitably configured to settle the OTA output signal rapidly, or in other words, provide a disproportionately high current output when the error between the desired signal and the actual signal is large, and provide a much reduced or zero current output when the error between the desired signal and the actual signal is small. Thus, the output current from the non-linear OTA is strongest when the high speed OTA should dominate the signal settling process, and is weakest when the high accuracy op-amp should dominate the signal settling process. In this manner, signal settling is further enhanced.

The OTA can be configured to function in a non-linear manner in a number of different ways, such as, by skewing the inputs and/or by using slew boost circuits, all in both rail to rail, and non-rail to rail embodiments. For example, a linear OTA may be configured to function as a non-linear OTA by skewing the transistors in the differential input stage. These differential input transistors may be skewed or weighted by multiplication factors to create a "dead-band" at low differential input voltage and to provide amplified current flow at high differential input voltage. In the dead-band, little or no current flows.

Figure 4:
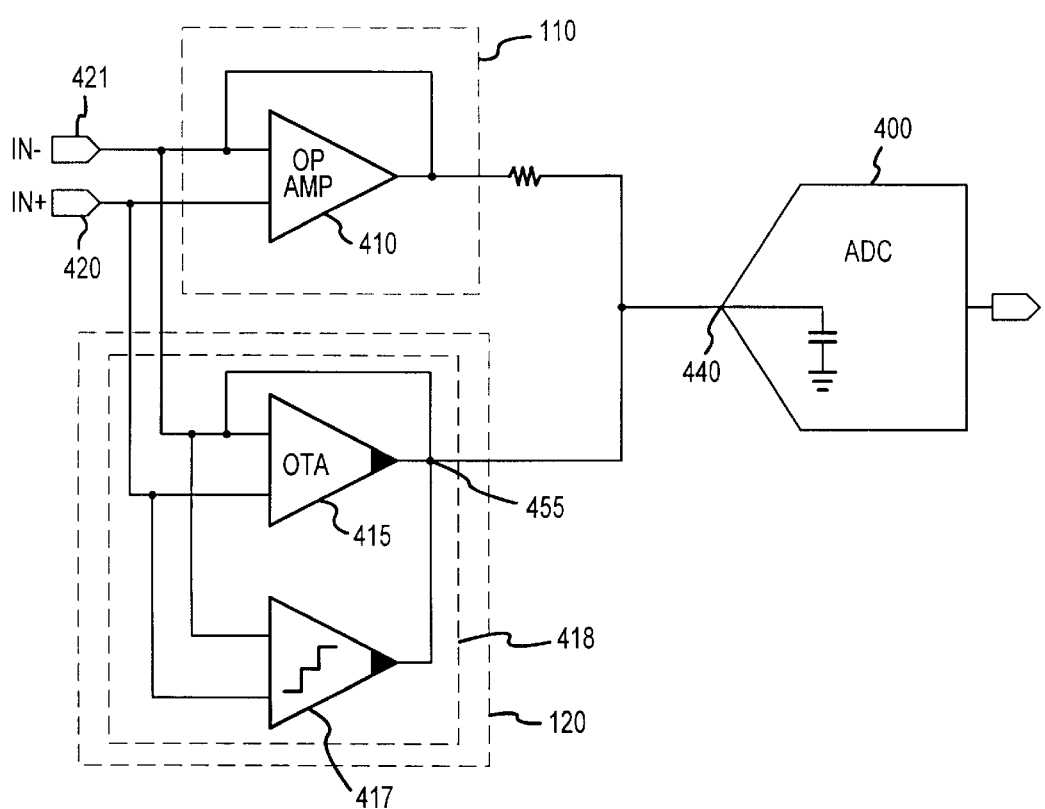
FIG. 4 illustrates a block diagram of an exemplary non-linear signal settling system device in accordance with an exemplary embodiment of the present invention.

In yet another example, a non-linear OTA comprises slew boost stage. With reference now to FIG. 4, an exemplary signal settling system 400 comprises a non-linear OTA 418. Non-linear OTA 418 may include a non-linear slew boost circuit 417 configured in parallel with a linear OTA 415. The slew boost circuit may be configured to facilitate additional slewing when the difference between the input signals is large, thus increasing the current output of the non-linear OTA and thus more rapidly charging the input capacitor(s) of an ADC. Signal inputs 420 and 421 are configured in communication with inputs to op-amp 410, linear OTA 415, and non-linear slew boost 417. Outputs from OTA 415 and slew boost 417 are connected at non-linear OTA output 455. Slew boost 417 may be configured to be a proportional step type boost circuit, although other slew boost circuits may also be used, such as those described in U.S. patent application Ser. No. 09/784,724, "Slew Rate Boost Circuitry And Method", having a common inventor and common assignee with the present application. Slew boost 417 may also be configured as a high output impedance device.

Figure 5:
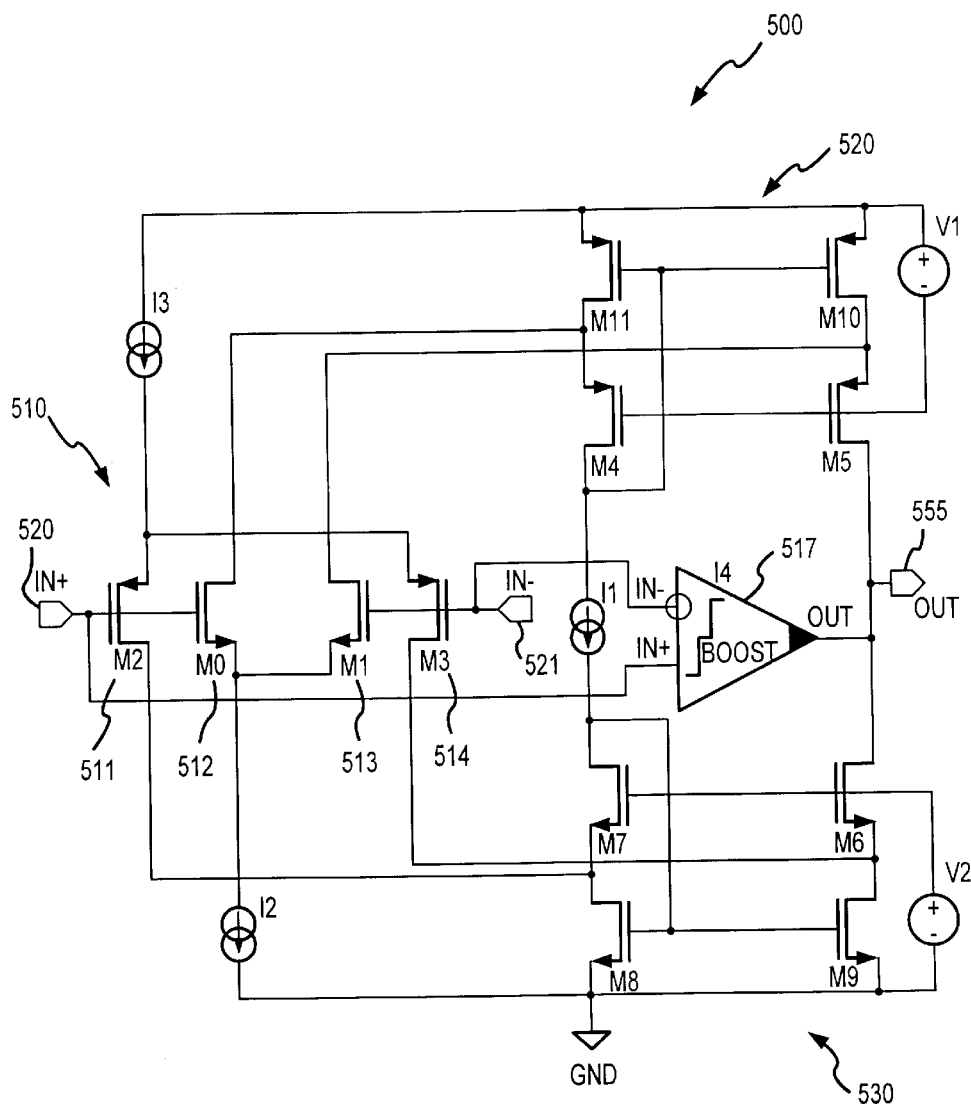
FIG. 5 illustrates a schematic diagram of an exemplary OTA and slew boost circuit in accordance with an exemplary embodiment of the present invention.

With reference now to FIG. 5, a more detailed exemplary embodiment of a non-linear OTA 500 comprises a slew boost stage 517. Slew boost stage 517 may comprise skewed differential inputs. Slew boost circuit 517 is configured in parallel with the linear OTA circuitry. Positive differential input 520 and negative differential input 521 are configured to receive input signals. These input signals are also received by slew boost circuit 517. Slew boost circuit 517 may be configured to increase current when the difference between inputs 520 and 521 is large. Differential input stage 510 is configured to create a proportional response as described above with reference to FIG. 3. Connecting the output 555 to negative differential input 521 causes the OTA to react to differences in the input voltage to settle the output. In this manner, the OTA is configured to provide high current output when input error is large and to provide a reduced current flow when input error is small. Thus the high speed OTA plays a prominent role in settling the output signal when the settling error is large and a minor role when the settling error is small.

The configuration and operation of OTA 500 may be better understood by reference to U.S. Pat. No. 6,359,512 B1, filed Jan. 18, 2001, entitled "Slew Rate Boost Circuitry and Method". This patent shares a common inventor, Vadim Ivanov, and a common assignee with the present application.

Although various configurations may be used, in one embodiment, OTA 500 may comprise a "rail-to-rail" type op-amp. Rail-to-rail op-amps may suitably handle input voltages close to that of their own power supply, thus extending the range of input voltages that can be received. This is particularly important because power supply voltage levels have decreased from ten and five volts down to three and one volts.

An op-amp circuit using only P-type transistors can only operate within a voltage range from the negative supply rail to the positive supply rail minus the gate-source voltage, VGS, and the saturation voltage, Vdsat, of a tail current source. Analogously, an op-amp circuit using only N-type transistors can operate only from the positive supply rail down to VGS and Vdsat above the negative rail voltage. Accordingly, in order to achieve rail-to-rail operation, a circuit uses a differential input stage comprising paired P-type transistors and paired N-type transistors.

An exemplary CMOS differential input stage 510 of a rail-to-rail op-amp 500 comprises two pairs of input transistors driven in parallel: P-type transistors 511 and 514; and N-type transistors 512 and 513. A current source 541 supplies the current for P-type transistors 511 and 514 while a current source 542 supplies the current for N-type transistors 512 and 513. A negative terminal 516 and a positive terminal 515 are the input terminals for this differential amplifier. Both negative terminal 516 and positive terminal 515 are coupled to both an N-type transistor and a P-type transistor. Specifically, positive terminal 515 is coupled to P-type transistor 511 and to N-type transistor 512; negative terminal 516 is coupled to P-type transistor 514 and N-type transistor 513.

Differential input 510, thus configured, proportionately changes the transconductance of the circuit with changes in the differential input voltage. However, non-linear OTA response may be achieved by varying the transistor surface area ratios or current transmitting ratios of transistors M2, M0, M1, and M3 (i.e., 511–514, respectively) creating a skewed differential input stage 510. In this configuration, a larger surface area facilitates a greater flow of current when the transistor is on.

In one example, a 2:1 ratio is selected such that M1 and M3 carry twice the current of M2 and M0. In this case, when little or no voltage difference exists between inputs 515 and 516, approximately equal current flows through both control lines to both upper current mirror 520 and lower current mirror 530 result in no current flow at output 555. However, when the voltage at positive input 515 becomes much larger than the voltage at negative input 516, the increase in current through transistor 513 and 514 is multiplied and thus a non-proportionate and high current flows through one of the two control lines to both current mirrors 520 and 530 causing a non-linear large output of current at OTA output 555.

The transistor ratios, such as 2:1 or 3:1, may be selected such that an appropriate size dead-band, for example, 50 mV, is provided at low differential input voltages. However, it is understood that other combinations of ratios may be used to achieve similar dead-bands, and other non-linear effects. Furthermore, current mirrors 520 and 530 are configured to be controlled via control lines from differential input stage 510, such that large differential input signals cause the output current to also be large. Also, current mirrors 520 and 530 are shielding devices, configured to generate a high output impedance for OTA 500.

Figure 6:
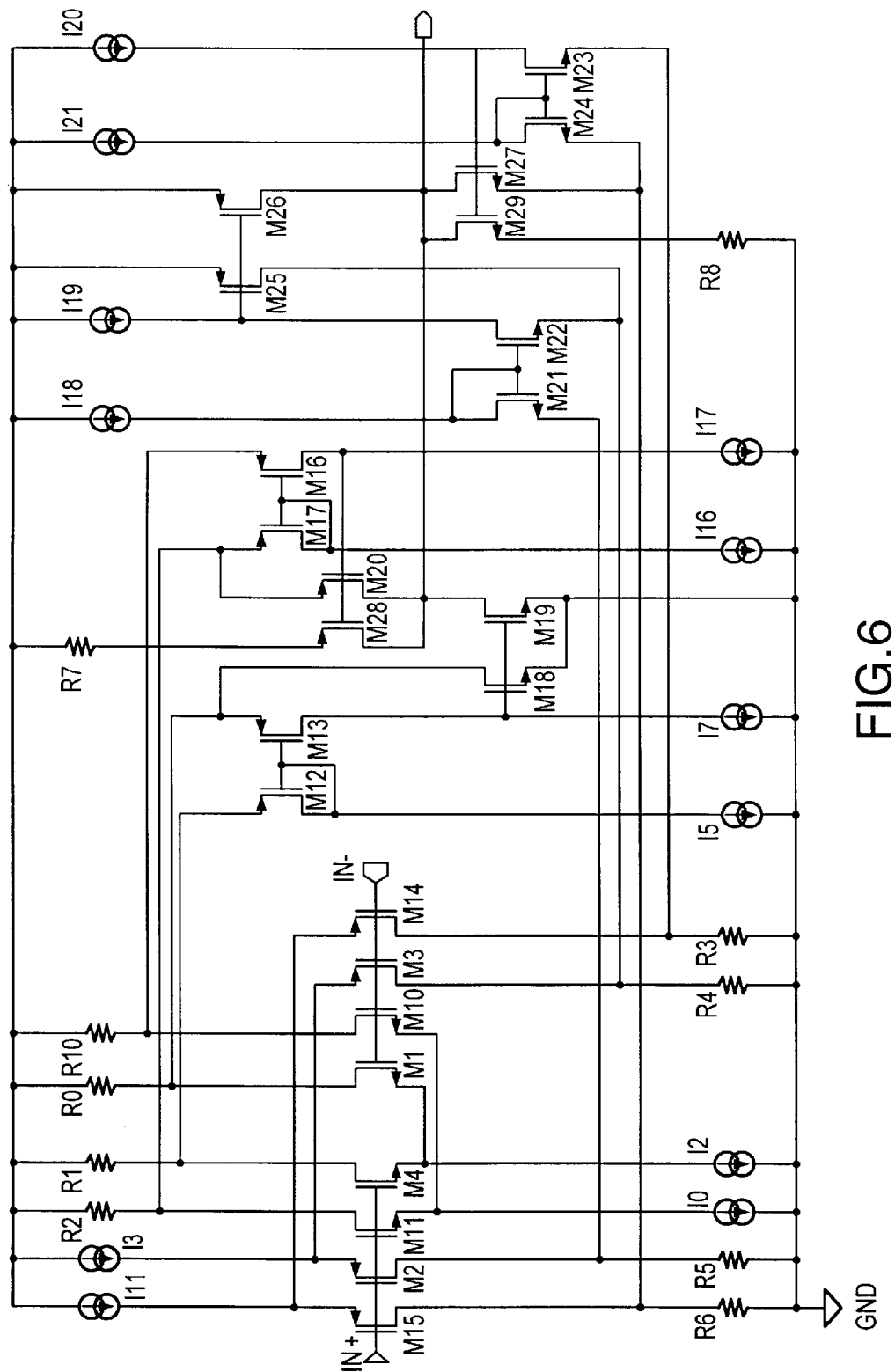
FIG. 6 illustrates a schematic diagram of an exemplary slew boost circuit in accordance with an exemplary embodiment of the present invention.

In one exemplary embodiment of a non-linear OTA, and with reference to FIG. 6, one possible implementation of the boost device 517 discussed with reference to FIG. 5 is illustrated. Differential input stage 610 is configured with input transistors 611–618. Input transistors 611–618 may be paired and/or may be skewed as discussed herein to provide a dead-band at low differential voltage and a high current at high differential voltage. In one exemplary embodiment, the input transistors are configured to have an N:1 ratio, where transistors 612, 613, 615 and 618 are configured to provide N times greater current output than transistors 611, 614, 616 and 617. In such a configuration, when the input error is less than the offset of the input differential pairs set by the size ratio N, there are no output currents as all of the transistors connected to the output are OFF. When the input error exceeds the value preset by N then the circuit provides current through the output pin with a value set by the current sources and the size ratios between transistors 661/662, 663/664, 665/666, and 667/668. Other embodiments of the slew boost circuit may be used, for example, if the circuit is modified to not be a rail-to-rail circuit.

With reference again to FIG. 2, signal settling system 200 may comprise any suitable signal sampling component such as, for example, successive approximation, dual slope integrating, charge balancing, flash converters, and sigma-delta converters. In one exemplary embodiment of the present invention, the signal sampling component may comprise an ADC. For example, signal settling system 200 comprises an ADC 280, an ADC input 240, an ADC output 290, and an input capacitance 281. ADC input capacitance 281 may comprise one or more input capacitors arranged in various series and parallel configurations. Input capacitance 281 may have any suitable capacitance value, for example, approximately 20 to 50 pF. ADC 200 is configured to generate a digital output, at ADC output 290, representing the signal received at ADC input 240.

In accordance with another aspect of the present invention, an ADC is configured to internally provide both quick and accurate signal settling. As discussed above, it is desirable to build ADC's such that conventional slower and accurate op-amps are compatible with the high performance ADC's. In an exemplary embodiment of the present invention, this compatibility is accomplished by configuring the ADC with an internal high speed OTA inside the ADC itself such that the internal high speed OTA again operates in parallel with an external high accuracy op-amp. In this manner, existing pre-ADC wiring configurations and layouts may not need to be modified to accommodate changing requirements in the high performance ADC's. This may provide a great savings in redesign costs and retooling costs. Furthermore, an ADC device capable of addressing its own performance requirements is valuable for its simplicity and compactness.

Figure 7:
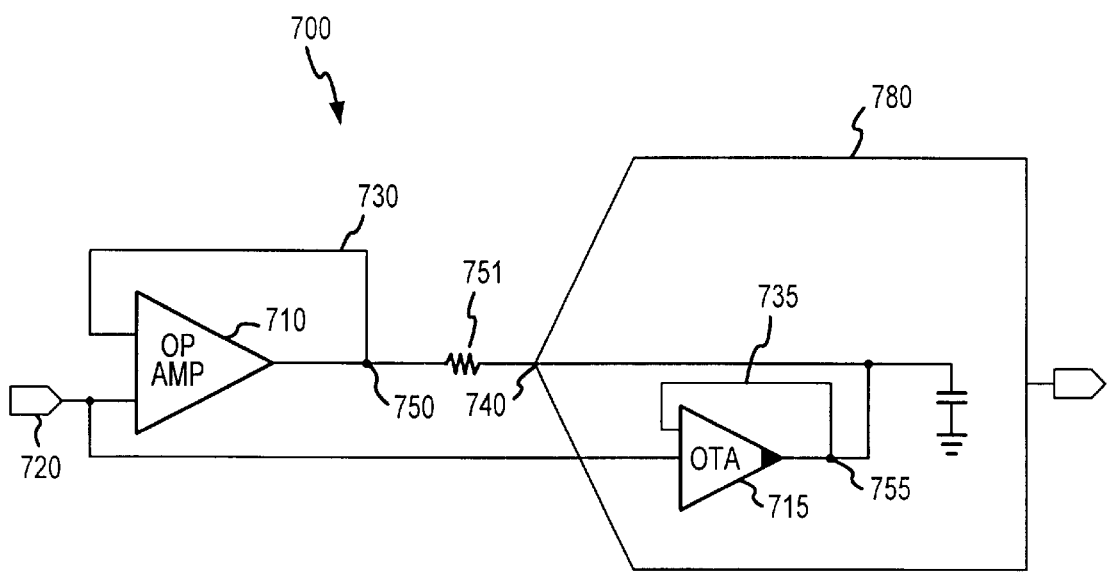
FIG. 7 illustrates a block diagram of an exemplary ADC settling system in accordance with an exemplary embodiment of the present invention.

With reference now to FIG. 7, an exemplary signal settling system 700 comprises an ADC 780 comprising an internal OTA 715. High accuracy op-amp 710 is configured, for example, in parallel with high speed OTA 715. Op-amp 710 and OTA 715 are both configured in communication with common input 720. Op-amp 710 and OTA 715 may also each be configured with feedback loops 730 and 735 from their respective outputs 750 and 755 to their respective negative inputs. In this case, OTA output 755 is connected to ADC input 740 and op-amp output 750 is connected across resistor 751 to ADC input 740.

The operation of the internal OTA configured signal settling system and method is similar to that described herein. Moreover, although the settling device described is an ADC, other devices could similarly incorporate an internal high speed op-amp with high output impedance and configured in parallel with high accuracy op-amps for signal settling.

The present invention has been described above with reference to exemplary embodiment(s). However, those skilled in the art will recognize that changes and modifications may be made to the exemplary embodiments without departing from the scope of the present invention. For example, the various components may be implemented in alternate ways. These alternatives can be suitably selected depending upon the particular application or in consideration of any number of factors associated with the operation of the system. In addition, the techniques described herein may be extended or modified for use with other types of devices, in addition to the ADC devices. These and other changes or modifications are intended to be included within the scope of the present invention.

What is claimed is:

1. An input signal settling system for use in an analog to digital converter ("ADC") system, the input signal settling system comprising:

an ADC comprising an ADC input port;

a high accuracy component configured to settle a first input signal with high accuracy and to communicate said high accuracy settled signal to said ADC input port;

a resistor configured between an output of said high accuracy component and said ADC input port; and a high speed component configured to settle said first input signal with high speed and in parallel with said high accuracy component and to communicate said high speed settled signal to said ADC input port.

2. The input signal settling system of claim 1 wherein said high accuracy component is an op-amp.

3. The input signal settling system of claim 1 wherein said high speed component is an OTA.

4. The input signal settling system of claim 3, wherein said OTA comprises a differential input stage configured to divide a constant current flow between two control lines to each of two current mirrors.

5. The input signal settling system of claim 3, wherein said OTA comprises an upper current mirror and a lower current mirror, and wherein said current mirrors are configured such that said OTA has a high output impedance.

6. The input signal settling system of claim 3 wherein said ADC comprises said OTA.

7. The input signal settling system of claim 3 wherein said OTA is external to said ADC.

8. The input signal settling system of claim 3 wherein said OTA is configured to be non-linear.

9. The input signal settling system of claim 8 wherein said OTA further comprises a slew boost stage.

10. The input signal settling system of claim 8 wherein said OTA is configured to cause an output current from said non-linear OTA to be strongest when said OTA should dominate the signal settling process, and is weakest when a high accuracy op-amp should dominate the signal settling process.

11. The input signal settling system of claim 1 wherein said high speed component is further configured to settle said first input signal to within less than 100 milli-volts of a true voltage level within less than 500 nanoseconds.

12. The input signal settling system of claim 11 wherein said high accuracy component is configured to further settle said first input signal to within less than 300 micro-volts of a true voltage level within less than 800 nanoseconds.

13. The input signal settling system of claim 1 wherein said high speed component and said high accuracy component are further configured to settle said first input signal to within less than 300 micro-volts of a true voltage level within less than 400 nanoseconds.

14. The input signal settling system of claim 1 wherein said high speed component and said high accuracy component are further configured such that said output voltage is accurate to within 0.0015% of the full scale voltage range within less than 500 nanoseconds.

15. An input signal settling system for use in an analog to digital converter ("ADC") system, the input signal settling system comprising:

an ADC comprising an ADC input port;

an op-amp configured to settle a first input signal with high accuracy and to communicate said high accuracy settled signal to said ADC input port;

a resistor configured between an output of said op-amp and said ADC input port; and an OTA configured to settle said first input signal with high speed and in parallel with said op-amp and to communicate said high speed settled signal to said ADC input port.

* * * * *